United States Patent
Chen et al.

(10) Patent No.: US 10,700,142 B2
(45) Date of Patent: Jun. 30, 2020

(54) ORGANIC ELECTROLUMINESCENT DISPLAY PANEL AND DISPLAY DEVICE

(71) Applicant: SHANGHAI TIANMA AM-OLED CO., LTD., Shanghai (CN)

(72) Inventors: Min Chen, Shanghai (CN); Kaihong Huang, Xiamen (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 23 days.

(21) Appl. No.: 15/961,850

(22) Filed: Apr. 24, 2018

(65) Prior Publication Data
US 2018/0240850 A1 Aug. 23, 2018

(30) Foreign Application Priority Data
Dec. 7, 2017 (CN) .......................... 2017 1 1286975

(51) Int. Cl.
| | |
|---|---|
| H01L 27/32 | (2006.01) |
| H01L 51/52 | (2006.01) |
| G06F 3/041 | (2006.01) |
| G06F 3/044 | (2006.01) |
| H01L 51/05 | (2006.01) |

(52) U.S. Cl.
CPC .......... H01L 27/323 (2013.01); G06F 3/044 (2013.01); G06F 3/0412 (2013.01); H01L 51/5203 (2013.01); *G06F 2203/04111* (2013.01); *H01L 27/32* (2013.01); *H01L 51/0541* (2013.01); *H01L 51/0545* (2013.01)

(58) Field of Classification Search
CPC ..... H01L 27/32; H01L 52/51; H01L 51/0541; H01L 51/0545; G06F 3/041; G06F 3/044; G06F 3/0416
USPC ............. 257/40, 59, 72; 438/82, 99, 48, 128
See application file for complete search history.

(56) References Cited

U.S. PATENT DOCUMENTS

| | | | |
|---|---|---|---|
| 2011/0090172 A1* | 4/2011 | Kaya et al. ............. | G06F 3/044 345/174 |
| 2013/0241841 A1* | 9/2013 | Orsley .................... | G06F 3/044 345/173 |
| 2017/0024056 A1* | 1/2017 | Wilkinson et al. ..... | G06F 3/041 |
| 2017/0185224 A1* | 6/2017 | Nagata et al. ........ | G06F 3/0418 |

* cited by examiner

*Primary Examiner* — Thinh T Nguyen
(74) *Attorney, Agent, or Firm* — Kilpatrick Townsend & Stockton, LLP (57) ABSTRACT

The disclosure discloses an organic electroluminescent display panel and a display device. The display panel includes at least one touch sensing element located in a rounded corner display area of the display panel. An outline of the at least one touch sensing element includes an arc. The arc lies against an outline of the rounded corner of the rounded corner display area. In this way, difference between the outline of the touch pattern of the display panel and the outline of the abnormally shaped display panel can be minimized to reduce the size of parts of touch sensing element(s) going beyond the rounded corner display area that need to be cut off and integrity of the pattern of the touch sensing element(s) can be improved, thus improving quality of response signals and the touch performance at the abnormally shaped edge.

20 Claims, 12 Drawing Sheets

ORGANIC ELECTROLUMINESCENT DISPLAY PANEL AND DISPLAY DEVICE

CROSS-REFERENCE TO RELATED APPLICATIONS

This application claims the benefit and priority of Chinese Patent Application No. CN 201711286975.5, filed Dec. 7, 2017, the content of which is hereby incorporated by reference in its entirety.

FIELD

The present disclosure relates to the field of display technologies, and particularly to an organic electroluminescent display panel and a display device.

BACKGROUND

Conventional display devices such as monitors, TV sets, mobile phones, tablet computers, etc., usually have regularly rectangular screens. With the development of display technologies, demand for touch screens having an abnormal shape continues to grow in industries producing on-vehicle products, dedicated monitors, and commodities to enhance customer experiences and improve products' appearances. Among existing technologies, a corner having an abnormal shape of a touch screen is generally a rounded corner (an R corner), and such a touch pattern is generally formed by cutting off an edge part that goes beyond the R corner. A larger radian the R corner has, a larger part of the touch pattern at the edge thereof needs to be cut off, resulting in a weaker touch signal at the edge and a degraded touch performance. In theory, a good touch performance can be achieved for a touch pattern with no less than 75% integrity, but radians of R corners of different electronic products having abnormal shapes are not unified, making it impossible for a current touch pattern to have satisfying touch performance at the edge thereof.

SUMMARY

An embodiment of the disclosure provides an organic electroluminescent display panel and a display device to address the existing problem that current touch patterns don't have satisfying touch performances at edges thereof.

In one aspect, an embodiment of the disclosure provides an organic electroluminescent display panel. The organic electroluminescent display panel includes at least one touch sensing element located in a rounded corner display area of the display panel. An outline of the at least one touch sensing element comprises an arc. The arc lies against an outline of the rounded corner of the rounded corner display area.

In one possible implementation, the organic electroluminescent display panel includes a plurality of touch sensing elements located in a display area of the display panel. The rounded corner display area is included in the display area. Each of the touch sensing elements includes a first touch sensing element and a second touch sensing element. The first touch sensing element includes first touch electrodes arranged in a first direction and at least one first connection electrode. Two adjacent first touch electrodes in the first direction are electrically connected via a first connection electrode. The second touch sensing element includes second touch electrodes arranged in a second direction and at least one second connection electrode. Two adjacent second touch electrodes in the second direction are electrically connected via a second connection electrode. Two adjacent first touch electrodes in the first direction are separated by at least one second touch electrode.

In one possible implementation, the first touch electrodes are driving electrodes, and the second touch electrodes are detecting electrodes.

In one possible implementation, both the first touch electrodes and the second touch electrodes are self-capacitive electrodes.

In one possible implementation, the first touch electrodes and the second touch electrodes are arranged at a same layer.

In one possible implementation, the first touch electrodes, the second touch electrodes, the first connection electrodes and the second connection electrodes are made of tin indium oxide (ITO).

In one possible implementation, the first touch electrodes, the second touch electrodes and the second connection electrodes are made of ITO, and the first connection electrodes are made of metal.

In one possible implementation, the touch sensing elements further include dummy electrodes each located between a first touch electrode and a second touch electrode adjacent thereto.

In one possible implementation, an outline of one of the dummy electrodes and a first touch electrode adjacent thereto includes the arc.

In one possible implementation, a curvature $\rho_1$ of the outline of the rounded corner of the rounded corner display area is greater than or equals to a curvature $\rho_2$ of the arc.

In one possible implementation, ρ1 is between 4.5 mm and 10 mm, and ρ2 is between 3.7 mm and 5.2 mm.

In one possible implementation, each dummy electrode is segmented into dummy sub-electrodes, and some of the dummy sub-electrodes are shared by two adjacent first touch electrodes in the second direction.

In one possible implementation, the dummy electrodes, the first touch electrodes and the second touch electrodes are made of a same material.

In one possible implementation, a central spacing between two adjacent first touch electrodes in the first direction equals to a central spacing between two adjacent second touch electrodes in the second direction.

In one possible implementation, the organic electroluminescent display panel further includes touch sensing elements located in a primary display area of the display panel. The rounded corner display area does not overlap the primary display area. An outline of each touch sensing element in the primary display area includes an arc.

In one possible implementation, the organic electroluminescent display panel further includes touch sensing elements located in a primary display area of the display panel. The rounded corner display area does not overlap the primary display area. An outline of the primary display area is rectangular.

In another aspect, the embodiment of the disclosure provides a display device. The display device includes the organic electroluminescent display panel. The organic electroluminescent display panel includes at least one touch sensing element located in a rounded corner display area of the display panel. An outline of the at least one touch sensing element comprises an arc. The arc lies against an outline of the rounded corner of the rounded corner display area.

DETAILED DESCRIPTION OF AN EMBODIMENT

Figure 1:
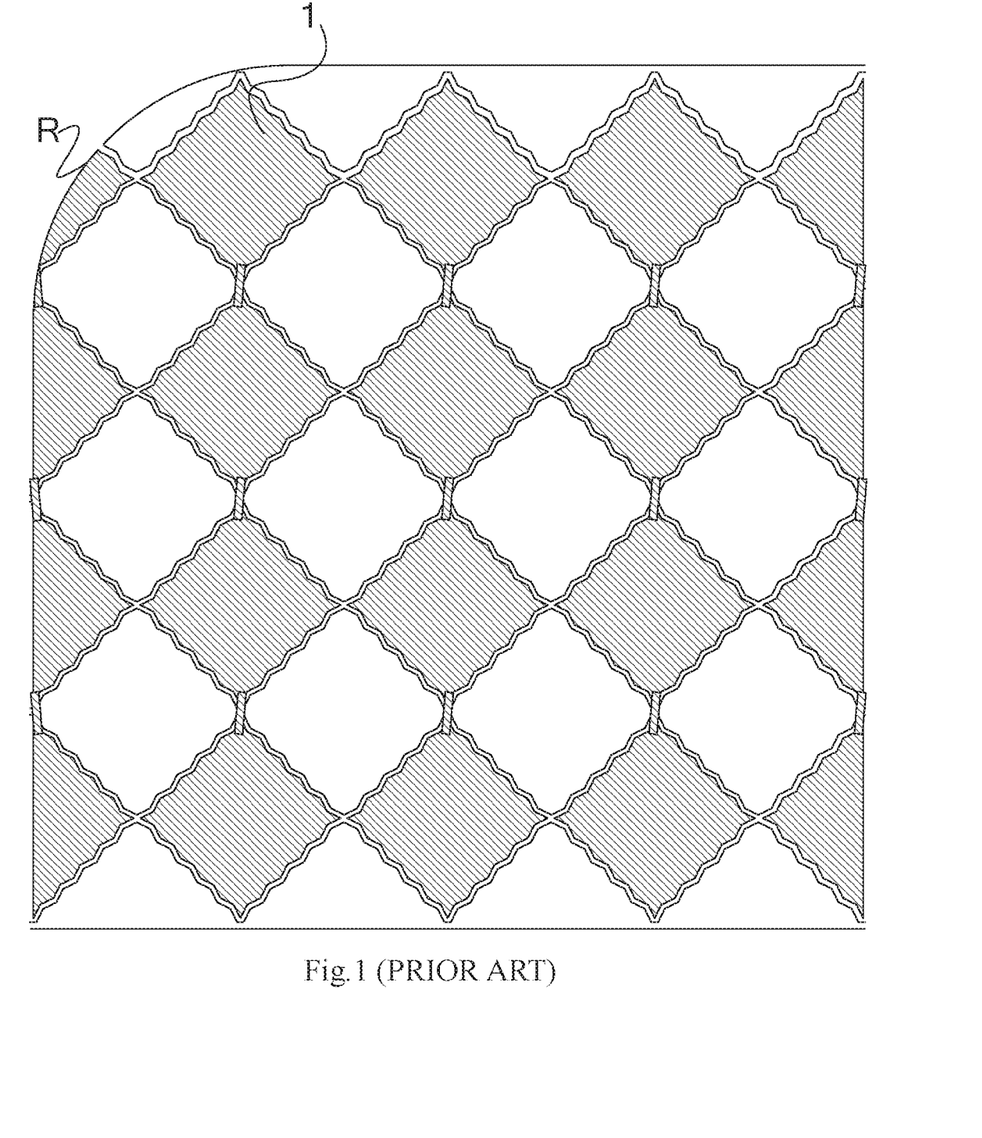
FIG. 1 is a schematic diagram of a current touch display panel.

FIG. 1 illustrates an existing touch pattern 1. The touch pattern 1 is generally a rhombus, and parts going beyond a corner of an abnormal shape, i.e., an R corner, needs to be cut off. A larger radian the R corner has, a larger part of the touch pattern 1 needs to be cut off, resulting in a weaker touch signal at the edge and a degraded touch performance. Among existing technologies, the curvature of the R corner in a touch product such as a mobile phone is generally between 4.5 mm and 10 mm. Table 1 depicts different radian curvatures of the R corner and corresponding integrity of the touch pattern 1. In theory, a good touch performance can be achieved for a touch pattern with no less than 75% integrity, According to Table 1, nearly none of the existing designs of the touch pattern has a satisfying integrity, and thus none of the designs can achieve the touch performance as required.

TABLE 1

| Radian of R corner | 4.5 mm | 5 mm | 5.5 mm | 6 mm | 8 mm | 9 mm |
| --- | --- | --- | --- | --- | --- | --- |
| Integrity | 78.6% | 73.6% | 68.3% | 62.9% | 41.3% | 31.6% |

To solve the existing problem that current touch patterns do not have satisfying touch performances at edges thereof, an embodiment of the disclosure provides an organic electroluminescent display panel and a display device. Particular implementations of the organic electroluminescent display panel and the display device according to the embodiment of the disclosure are described below in details with reference to the drawings. It shall be appreciated that the embodiment described below merely illustrates and explains the disclosure, and it is not used to limit the disclosure thereto. Moreover the implementations of the disclosure and the features of the implementations can be combined unless they conflict with each other.

The shapes and sizes of each component in the drawings do not reflect the real scales, but are merely intended to illustrate the contents of the disclosure.

Figure 2:
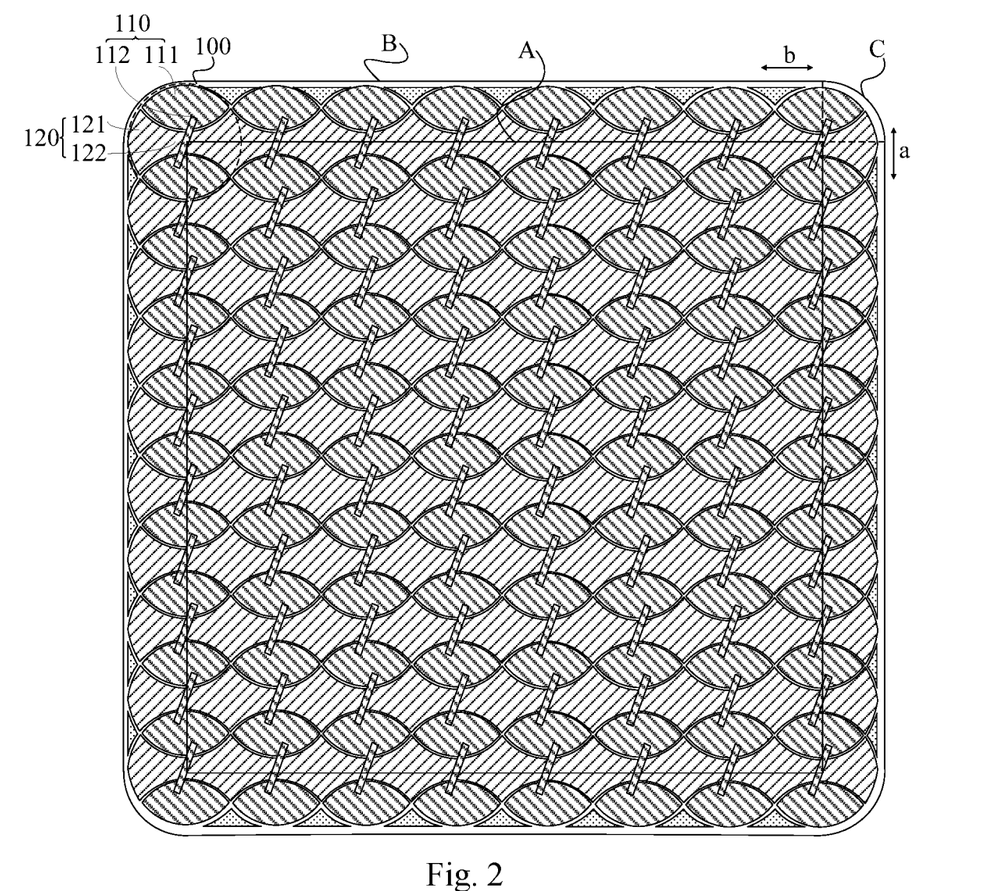
FIG. 2 is a first schematic diagram of an organic electroluminescent display panel according to an embodiment of the disclosure.
Figure 3:
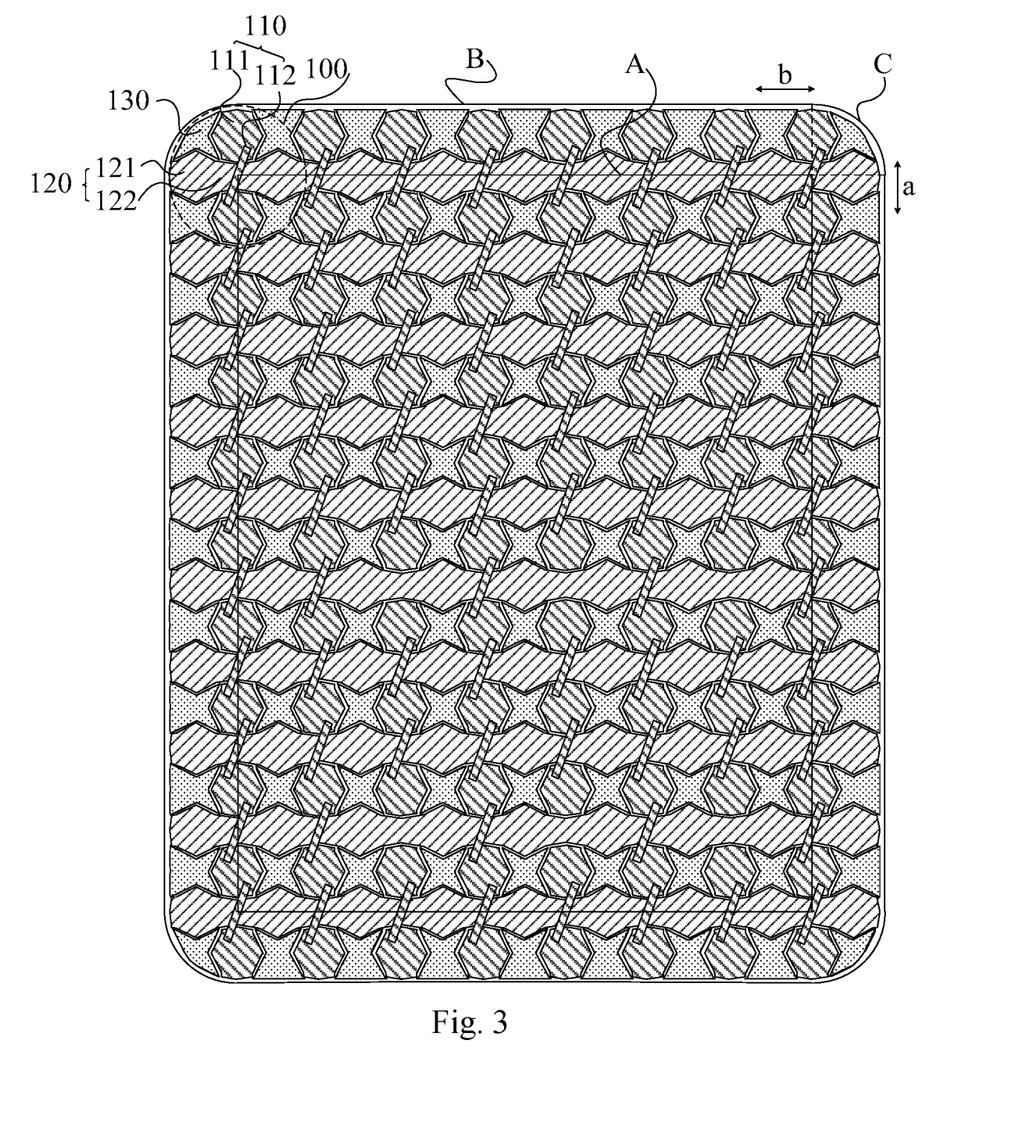
FIG. 3 is a second schematic diagram of the organic electroluminescent display panel according to the embodiment of the disclosure.
Figure 4:
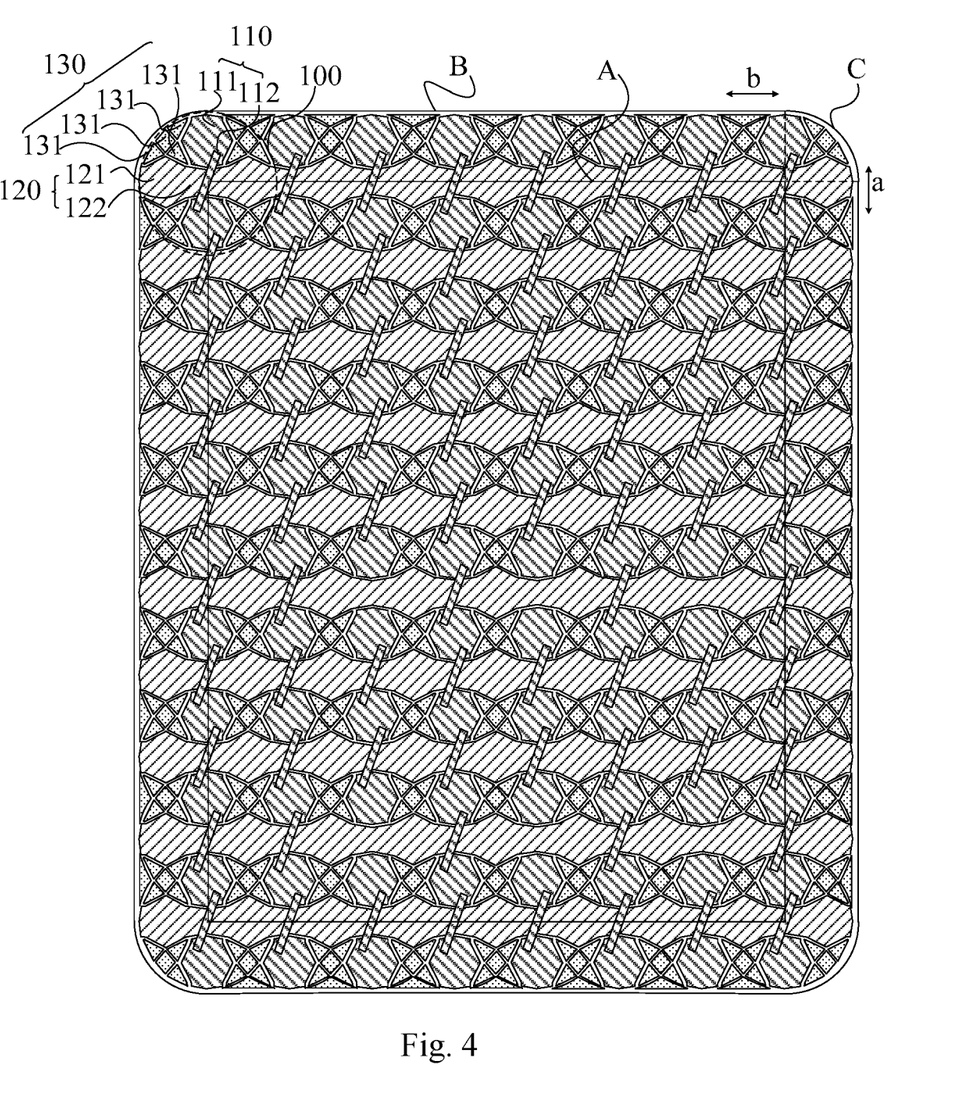
FIG. 4 is a third schematic diagram of the organic electroluminescent display panel according to the embodiment of the disclosure.

As illustrated by FIG. 2 to FIG. 4, an organic electroluminescent display panel according to the embodiment of the disclosure includes at least one touch sensing element 100 located in a rounded corner area C of the display panel. An outline of the at least one touch sensing element 100 includes an arc and the arc lies against an outline of the rounded corner of the rounded corner display area C.

In one implementation, as illustrated by FIG. 2 to FIG. 4, the arc of the outline of the at least one touch sensing element 100 is approximately the same as the outline of the rounded corner of the rounded corner display area C. For example, the arc of the outline of the at least one touch sensing element 100 and the outline of the rounded corner of the rounded corner display area C can be arcs having some differences, but such differences lie in an allowable range of the art.

In one implementation, as illustrated by FIG. 2 to FIG. 4, the organic electroluminescent display area has a display area. The display area includes a primary display area A and an edge display area B. The primary display area A and edge display area B each have touch sensing elements 100. The edge display area B includes the rounded corner display area C. An area outside the display area constitutes a non-display area. Generally, the primary display area A is a rectangular area, and display areas surrounding the primary display area A constitute the edge display area B. The edge display area B may include all the areas at a distance between 0 mm and 4.5 mm from the non-display area. The rounded corner display area C is an area where an R corner is located, and the radian of the R corner is approximately between 4.5 mm and 10 mm. Since the arc of the outline of the at least one touch sensing element 100 in the rounded corner display area C generally does not go beyond the outline of the corresponding rounded corner display area C, a radian curvature of the arc is generally between 3.7 mm and 5.2 mm.

In one implementation, e.g., if the radian curvature of the arc of the outline of the at least one touch sensing element 100 in the rounded corner display area C is 4.02 mm, Table 2 depicts the integrity of the at least one touch sensing element 100 when the rounded corner display area C has different radian curvatures. According to Table 2, the organic electroluminescent display panel according to the embodiment of the disclosure can provide substantially satisfying integrity, and thus can achieve the touch performance as required.

TABLE 2

| Radian of R corner | 4.5 mm | 5 mm | 5.5 mm | 6 mm | 8 mm | 9 mm |
| --- | --- | --- | --- | --- | --- | --- |
| Integrity | 95.4% | 92.7% | 86.7% | 80.2% | 73.2% | 65.9% |

Comparing with the existing rhombus-shaped touch pattern, in the organic electroluminescent display panel according to the embodiment of the disclosure, the outline of the at least one touch sensing element 100 in the rounded corner display area C includes an arc lying against the outline of the rounded corner of the rounded corner display area C, so the difference between the outline of the touch pattern (constituted by all the touch sensing elements 100 in the display area) of the display panel and the outline of the abnormally shaped display panel can be minimized to reduce the size of parts of the least one touch sensing element 100 going beyond the rounded corner display area C that need to be cut off, and the integrity of the pattern of the touch sensing element 100 is improved. Comparing with the existing touch pattern design, the organic electroluminescent display panel according to the embodiment of the disclosure enlarges a signal sensing area by approximately 20%, improves quality of response signals at the abnormally shaped edge, and improves the touch performance at the abnormally shaped edge.

In one implementation, in the organic electroluminescent display panel according to the embodiment of the disclosure, in order to guarantee the continuity of the touch pattern in the display area, typically adjacent touch sensing elements 100 could have a common area as illustrated by FIG. 2 to FIG. 4. FIG. 2 to FIG. 4 merely illustrate the patterns of the touch sensing elements 100 by way of examples, and the embodiment of the disclosure is be limited thereto.

Figure 5:
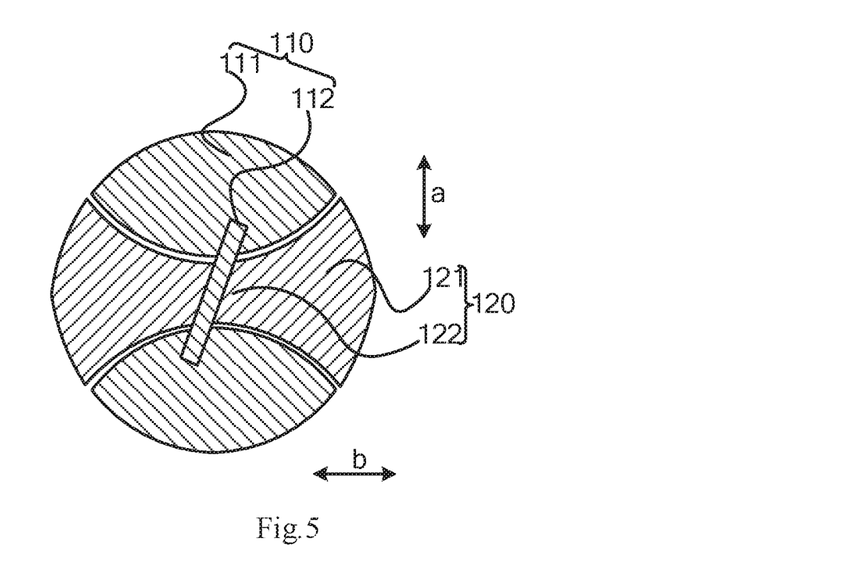
FIG. 5 is a schematic diagram of a touch sensing element in FIG. 2.
Figure 6:
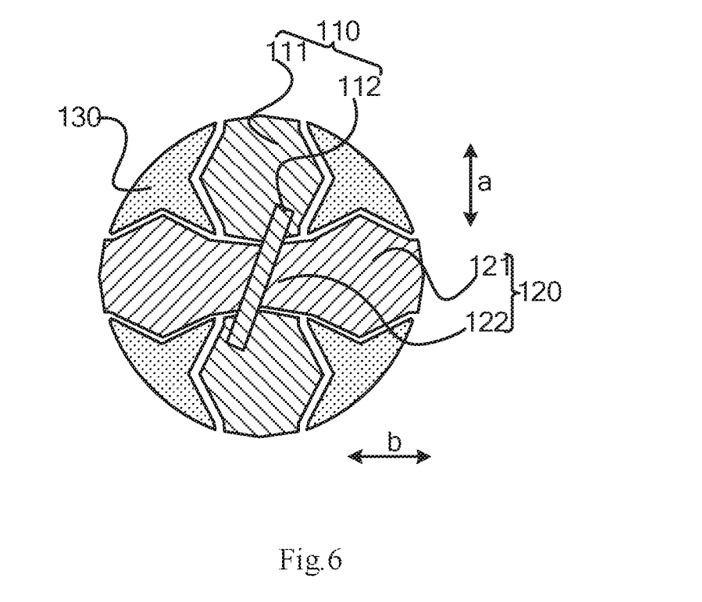
FIG. 6 is a schematic diagram of a touch sensing element in FIG. 3.
Figure 7:
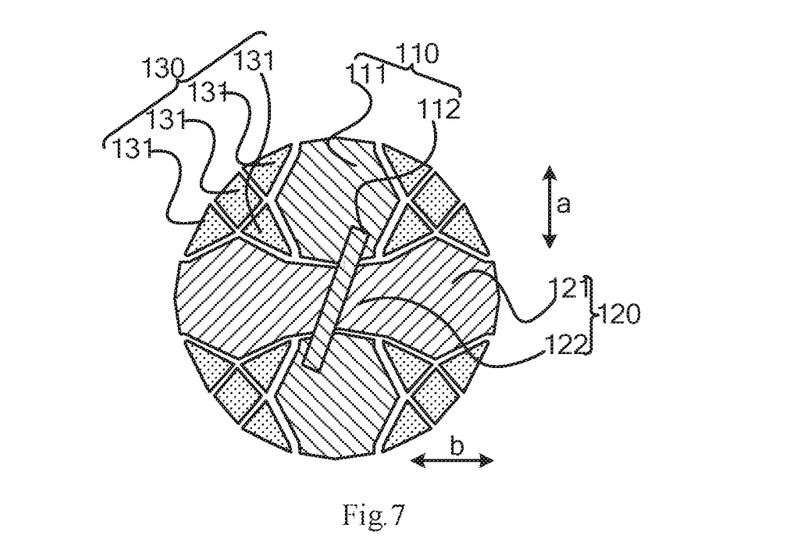
FIG. 7 is a schematic diagram of a touch sensing element in FIG. 4.

In one implementation, in the organic electroluminescent display panel according to the embodiment of the disclosure, as illustrated by FIG. 5 to FIG. 7, a touch sensing element 100 can include a first touch sensing element 110 and a second touch sensing element 120. The first touch sensing element 110 includes first touch electrodes 111 arranged in a first direction a and at least one first connection electrode 112. Two adjacent first touch electrodes 111 are electrically connected via a first connection electrode 112. The second touch sensing element 120 includes second touch electrodes 121 arranged in a second direction b and at least one second connection electrode 122. Two adjacent second touch electrodes 121 are electrically connected via a second connection electrode 122. Two adjacent first touch electrodes 111 in the first direction a are separated by at least one second touch electrode 121.

FIG. 5 illustrates a structure of a touch sensing element 110 in FIG. 2. FIG. 6 illustrates a structure of a touch sensing element 110 in FIG. 3. And FIG. 7 illustrates a structure of a touch sensing element 110 in FIG. 4.

FIG. 5 to FIG. 7 exemplarily illustrate the first direction a as the vertical direction, and the second direction b as the horizontal direction. In a particular implementation, the first direction a can be the horizontal direction the second direction b can be the vertical direction. The first touch electrodes 111 and the first connection electrodes 112 can be integrated, or can be separated structures electrically connected with each other, although the embodiment of the disclosure is not be limited thereto. Similarly, the second touch electrodes 121 and the second connection electrodes 122 can be integrated, or can be separated structures electrically connected with each other, although the embodiment of the disclosure is not be limited thereto. Moreover, the patterns of the first touch electrodes 111, the first connection electrodes 112, the second touch electrodes 121, and the second connection electrodes 122 can have any shapes as long as the outline of the at least one touch sensing element 100 in the rounded corner display area C has an arc lying against the outline of the rounded corner display area C.

In one implementation, in the organic electroluminescent display panel according to the embodiment of the disclosure, the first touch electrodes 111 can be driving electrodes Tx, and accordingly the second touch electrodes 121 can be detecting electrodes, where they constitute mutually-capacitive touch structures. Alternatively the first touch electrodes 111 and the second touch electrodes 121 can be self-capacitive electrodes Cm and constitute self-capacitive touch structures.

In one implementation, in the organic electroluminescent display panel according to the embodiment of the disclosure, the first touch electrodes 111 and the second touch electrodes 121 can be arranged at the same layer to reduce the thickness of the touch sensing element 100. In one implementation, the first touch electrodes 111 and the second touch electrodes 121 may alternatively be arranged at different layers, although the embodiment of the disclosure is not limited thereto.

In one implementation, in the organic electroluminescent display panel according to the embodiment of the disclosure, the first touch electrodes 111, the second touch electrodes 121, the first connection electrodes 112, and the second connection electrodes 122 can be made of indium tin oxide (ITO) to ensure good transparency of the touch sensing elements 100 so as to alleviate an influence on display brightness of the organic electroluminescent display panel.

In one implementation, in the organic electroluminescent display panel according to the embodiment of the disclosure, the first touch electrodes 111, the second touch electrodes 121, and the second connection electrodes 122 can alternatively be made of ITO, and the first connection electrodes 112 can be made of metal to thereby enhance connections. In one implementation, the metal can be Mo, Al/Mo, Mo/Al/Mo, etc.

In one implementation, in the organic electroluminescent display panel according to the embodiment of the disclosure, the first touch electrodes 111, the second touch electrodes 121, the first connection electrodes 112, and the second connection electrodes 122 can alternatively be made of metal grids to improve a transmission speed of a touch signal of the touch sensing element 100s. In one implementation, the metal material can be Mo, Al/Mo, Mo/Al/Mo, etc.

In one implementation, in the organic electroluminescent display panel according to the embodiment of the disclosure, the first touch electrodes 111, the second touch electrodes 121, the first connection electrodes 112 and the second connection electrodes 122 can alternatively be made of another material, although the embodiment of the disclosure is not limited thereto.

In one implementation, in the organic electroluminescent display panel according to the embodiment of the disclosure, the touch sensing elements 100 can further include dummy electrodes 130 each located between a first touch electrodes 111 and a second touch electrode 121 adjacent thereto as illustrated in FIG. 6 and FIG. 7.

In one implementation, as illustrated by FIGS. 6-7, some of the dummy electrodes 130 are also located between two adjacent first touch electrodes 111 in the second direction b, and thus can alleviate interference between touch signals of the two adjacent first touch electrodes 111, and a gap between the two adjacent first touch electrodes 111 can be further filled to create a uniform pattern of the touch sensing elements 100 as a whole without any significant empty area. Furthermore the dummy electrodes 130 are generally arranged floating, that is, no electrical signal is applied thereto.

Figure 8:
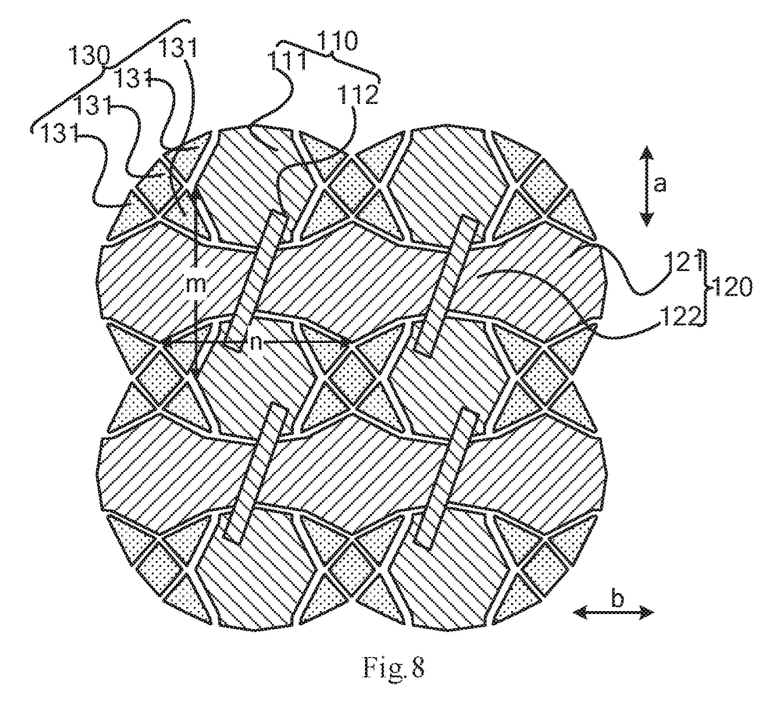
FIG. 8 is a schematic diagram of 2*2 touch sensing elements in FIG. 4.

In one implementation, in the organic electroluminescent display panel according to the embodiment of the disclosure, each dummy electrode 130 can be segmented into dummy sub-electrodes 131 as illustrated by FIG. 7 and FIG. 8, and some of the dummy sub-electrodes 131 can be shared between two adjacent first touch electrodes 111 in the second direction b.

In one implementation, each dummy electrode 130 is segmented into dummy sub-electrodes 131, and each dummy sub-electrode 131 has at most one side adjacent to one of the first touch electrodes 111, and has at most one other side connected with another dummy sub-electrode 131, to further alleviate interference between signals of the first touch electrodes 111. The embodiment of the disclosure is not limited to any particular shape and quantity of dummy sub-electrodes 131 in a particular implementation.

In one implementation, in the organic electroluminescent display panel according to the embodiment of the disclosure, the dummy sub-electrodes 131, the first touch electrodes 111 and the second touch electrodes 121 are generally made of a same material. For example, the dummy sub-electrodes 131, the first touch electrodes 111 and the second touch electrodes 121 can be made of an ITO material or a metal material, although the embodiment of the disclosure is not limited thereto.

Furthermore, the dummy electrodes 130 can be arranged at the same layer as the first touch electrodes 111 and the second touch electrodes 121 to reduce the thickness of the touch sensing elements 100. In one implementation, the dummy electrodes 130 can alternatively be arranged at a different layer from the first touch electrodes 111 and the second touch electrodes 121, although the embodiment of the disclosure is not limited thereto.

Figure 9:
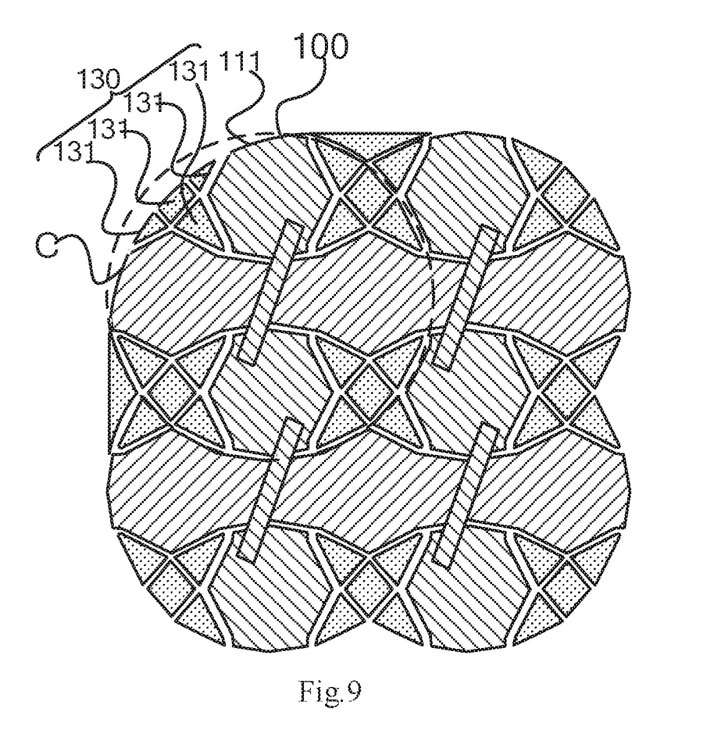
FIG. 9 to FIG. 11 are schematic diagrams of different rounded-corner display areas in the organic electroluminescent display panel according to the embodiment of the disclosure.
Figure 10:
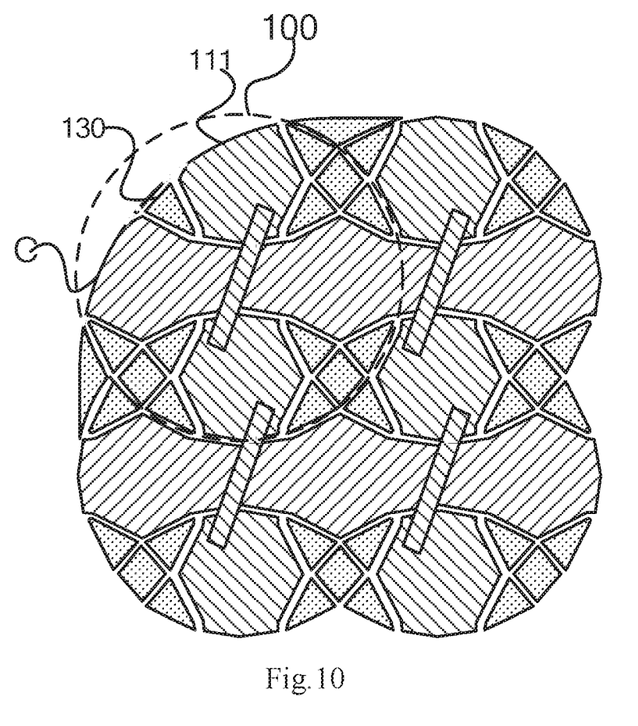
Figure 11:
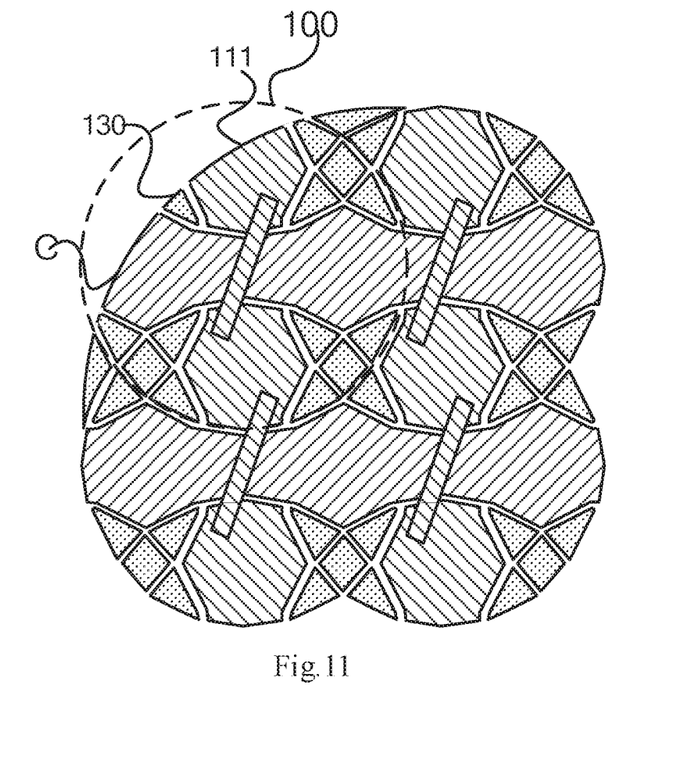

In one implementation, in the organic electroluminescent display panel according to the embodiment of the disclosure, as illustrated in FIG. 9 to FIG. 11, an outline of one of the dummy electrodes 130 and a first touch electrode 111 adjacent thereto includes the arc which lies again the outline of the rounded corner of the rounded corner display area C. Or, an outline of one of the dummy electrodes 130 and first and second touch electrodes 111 and 121 adjacent thereto includes the arc which lies again the outline of the rounded corner of the rounded corner display area C.

In one implementation, in the organic electroluminescent display panel according to the embodiment of the disclosure, as illustrated in FIG. 9 to FIG. 11, the curvature of the outline of the rounded corner of the rounded corner display area C, $\rho_1$, is generally between 4.5 mm and 10 mm, and the curvature of the arc of the outline of the dummy electrode 130 and the first touch electrode 111 adjacent thereto, $\rho_2$, is generally between 3.7 mm and 5.2 mm.

In one implementation, the value of $\rho_2$ can be designed according to a desired value $\rho_1$. Values of the curvature of the arc of the outline of the dummy electrode 130 and the first touch electrode 111 adjacent thereto, $\rho_2$, remain the same throughout FIG. 9 to FIG. 11. But a value $\rho_{11}$ of the curvature of the outline of the rounded corner of the rounded corner display area C in FIG. 9 is smaller than a value $\rho_{12}$ of the curvature of the outline of the rounded corner of the rounded corner display area C in FIG. 10, which is smaller than a value $\rho_{13}$ of the curvature of the outline of the rounded corner of the rounded corner display area C in FIG. 11. It can be observed from FIGS. 9 to 11 that the integrity of the touch sensing element 100 varies when values of the curvature of the outline of the rounded corner of the rounded corner display area C varies. Apparently when there is a larger difference between the curvature of the outline of the rounded corner of the rounded corner display area C, $\rho_1$, and the curvature of the arc of the outline of the dummy electrode 130 and the first touch electrode 111 adjacent thereto, $\rho_2$, there is lower integrity of the touch sensing element 100.

In one implementation, in the organic electroluminescent display panel according to the embodiment of the disclosure, each touch sensing element 100 can be segmented particularly with reference to the aspect ratio and touch precision of the screen of the organic electroluminescent display panel. In the touch sensing element 100, the ratio of the central spacing m between two adjacent first touch electrodes 111 in the first direction a, to the central spacing n between two adjacent second touch electrodes 121 in the second direction b can be adjusted according to the particular arc shape of the rounded corner display area C. If the particular arc shape of the rounded corner display area C (i.e., the outline of the rounded corner of the rounded corner display area C) is a part of a circle, then the ratio of the central spacing m between two adjacent first touch electrodes 111 in the first direction a, to the central spacing n between two adjacent second touch electrodes 121 in the second direction b is generally 1, that is, the central spacing m is equal to the central spacing n, as illustrated by FIG. 8. If the particular arc shape of the rounded corner display area C is a part of an ellipse, then the ratio of the central spacing m between two adjacent first touch electrodes 111 in the first direction a is generally be unequal to the central spacing n between two adjacent second touch electrodes 121 in the second direction b.

In one implementation, as illustrated by FIGS. 2 to 4, in the organic electroluminescent display panel according to the embodiment of the disclosure, an outline of each touch sensing element 100 in the primary display area A includes an arc. And the arc could be the same as the outline of the rounded corner of the rounded corner display area C. In this way, the uniformity of the touch sensing elements 100 in the display area as a whole can be guaranteed. In another implementation, touch sensing elements 100 having an arc shape (i.e., the outline of each of such touch sensing elements 100 has an arc) may alternatively be only arranged in the edge display area B while touch sensing elements 100 in the primary area A still have traditional touch patterns or other touch patterns, although the embodiment of the disclosure is not limited thereto.

Figure 12:
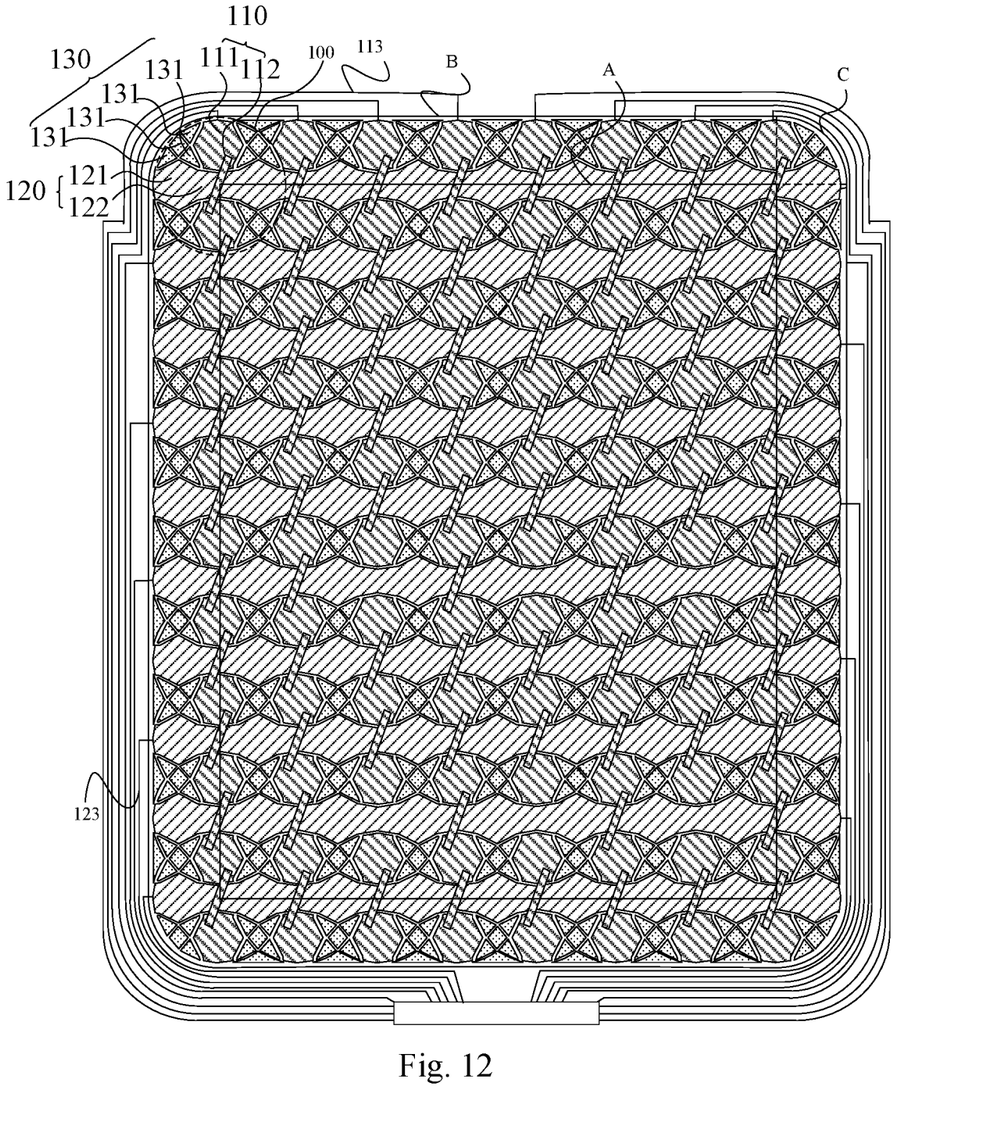
FIG. 12 is a fourth schematic diagram of the organic electroluminescent display panel according to the embodiment of the disclosure.

In one implementation, in the organic electroluminescent display panel according to the embodiment of the disclosure, as illustrated by FIG. 12, a first touch electrode 111 arranged in the first direction a is generally connected, at the edge of the display area, with one end of a first touch signal line 113 arranged in the non-display area and the other end of the first touch signal line 113 is connected with a touch chip. A second touch electrodes 121 arranged in the second direction b is generally connected, at the edge of the display area, with one end of a second touch signal line 123 arranged in the non-display area, and the other end of the second touch signal line 123 is connected with the touch chip.

Figure 13:
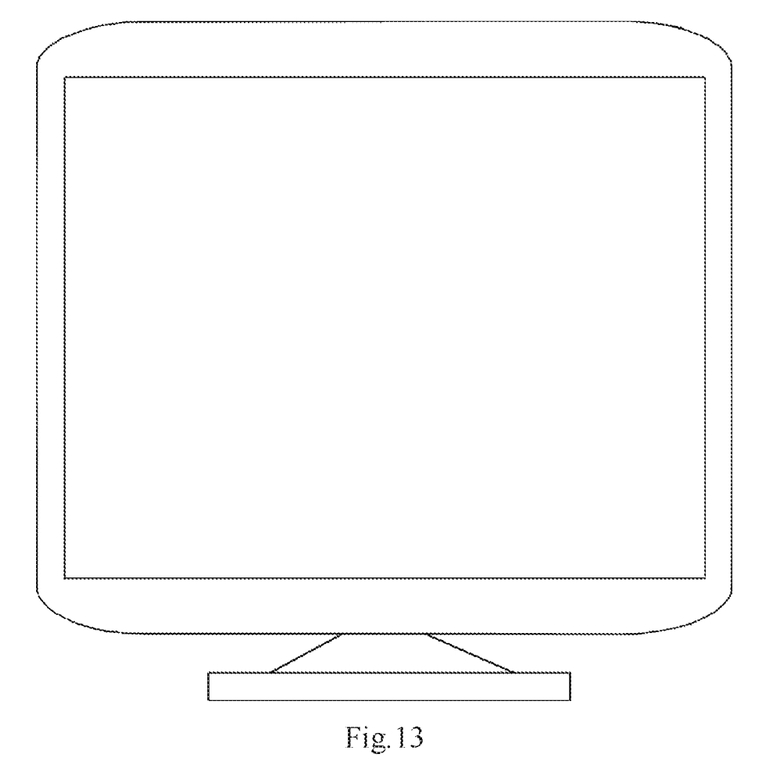
FIG. 13 is a schematic diagram of a display panel according to an embodiment of the disclosure.

Based upon the same inventive idea, the embodiment of the disclosure further provides a display device as illustrated by FIG. 13, which includes the organic electroluminescent display panel according to the embodiment of the disclosure. The display device can be a product or component with a display function such as a mobile phone, a tablet computer, a TV set, a monitor, a notebook computer, a digital photo frame, and a navigator. Reference can be made to the embodiment of the organic electroluminescent display panel above for an implementation of the display device, so a repeated description thereof is omitted here.

In the organic electroluminescent display panel and the display device according to the embodiment of the disclosure, the organic electroluminescent display panel includes a primary display area and an edge display area. The display panel includes at least one touch sensing element located in a rounded corner display area of the display panel. An outline of the at least one touch sensing element includes an arc. The arc lies against an outline of the rounded corner of the rounded corner display area. In this way, difference between the outline of the touch pattern of the display panel and the outline of the abnormally shaped display panel can be minimized to reduce the size of parts of touch sensing element(s) going beyond the rounded corner display area that need to be cut off and integrity of the pattern of the touch sensing element(s) can be improved, thus improving quality of response signals and the touch performance at the abnormally shaped edge.

The invention claimed is:

1. An organic electroluminescent display panel, comprising:
   a plurality of touch sensing elements located in a display area of the display panel,
   wherein,
   an outline of at least one touch sensing element located in a rounded corner display area included in the display area comprises an arc; and
   the arc lies against an outline of the rounded corner of the rounded corner display area;
   wherein,
   each of the touch sensing elements comprises a first touch sensing element and a second touch sensing element;
   the first touch sensing element comprises first touch electrodes arranged in a first direction and at least one first connection electrode;
   two adjacent first touch electrodes in the first direction are electrically connected via a first connection electrode;
   the second touch sensing element comprises second touch electrodes arranged in a second direction and at least one second connection electrode;
   two adjacent second touch electrodes in the second direction are electrically connected via a second connection electrode; and
   two adjacent first touch electrodes in the first direction are separated by at least one second touch electrode;
   wherein the first touch electrodes and the second touch electrodes are arranged at a same layer.

2. The organic electroluminescent display panel according to claim 1, wherein the first touch electrodes are driving electrodes and the second touch electrodes are detecting electrodes.

3. The organic electroluminescent display panel according to claim 1, wherein the first touch electrodes and the second touch electrodes are self-capacitive electrodes.

4. The organic electroluminescent display panel according to claim 1, wherein the first touch electrodes, the second touch electrodes, the first connection electrodes, and the second connection electrodes are made of tin indium oxide (ITO).

5. The organic electroluminescent display panel according to claim 1, wherein the first touch electrodes, the second touch electrodes and the second connection electrodes are made of ITO, and the first connection electrodes are made of metal.

6. An organic electroluminescent display panel, comprising:
   a plurality of touch sensing elements located in a display area of the display panel,
   wherein,
   an outline of at least one touch sensing element located in a rounded corner display area included in the display area comprises an arc; and
   the arc lies against an outline of the rounded corner of the rounded corner display area;
   wherein,
   each of the touch sensing elements comprises a first touch sensing element and a second touch sensing element;
   the first touch sensing element comprises first touch electrodes arranged in a first direction and at least one first connection electrode;
   two adjacent first touch electrodes in the first direction are electrically connected via a first connection electrode;
   the second touch sensing element comprises second touch electrodes arranged in a second direction and at least one second connection electrode;
   two adjacent second touch electrodes in the second direction are electrically connected via a second connection electrode; and
   two adjacent first touch electrodes in the first direction are separated by at least one second touch electrode;
   wherein the touch sensing elements further comprise dummy electrodes each located between a first touch electrode and a second touch electrode adjacent thereto.

7. The organic electroluminescent display panel according to claim 6, wherein an outline of one of the dummy electrodes and a first touch electrode adjacent thereto comprises the arc.

8. The organic electroluminescent display panel according to claim 1, wherein a curvature $\rho_1$ of the outline of the rounded corner of the rounded corner display area is greater than or equals to a curvature $\rho_2$ of the arc.

9. The organic electroluminescent display panel according to claim 1, wherein a curvature $\rho_1$ of the outline of the rounded corner of the rounded corner display area is between 4.5 mm and 10 mm, and a curvature $\rho_2$ of the arc is between 3.7 mm and 5.2 mm.

10. The organic electroluminescent display panel according to claim 6, wherein each dummy electrode is segmented into dummy sub-electrodes, and some of the dummy sub-electrodes are shared by two adjacent first touch electrodes in the second direction.

11. The organic electroluminescent display panel according to claim 6, wherein the dummy electrodes, the first touch electrodes and the second touch electrodes are made of a same material.

12. The organic electroluminescent display panel according to claim 1, wherein a central spacing between two adjacent first touch electrodes in the first direction equals to a central spacing between two adjacent second touch electrodes in the second direction.

13. The organic electroluminescent display panel according to claim 1, further comprising:
    touch sensing elements located in a primary display area of the display panel;
    wherein,
    the rounded corner display area does not overlap the primary display area; and
    an outline of each touch sensing element in the primary display area comprises an arc.

14. The organic electroluminescent display panel according to claim 1, further comprising:
    touch sensing elements located in a primary display area of the display panel;
    wherein,
    the rounded corner display area does not overlap the primary display area; and
    an outline of the primary display area is rectangular.

15. The organic electroluminescent display panel according to claim 6, wherein the first touch electrodes are driving electrodes and the second touch electrodes are detecting electrodes.

16. The organic electroluminescent display panel according to claim 6, wherein the first touch electrodes and the second touch electrodes are self-capacitive electrodes.

17. The organic electroluminescent display panel according to claim 6, wherein a curvature $\rho_1$ of the outline of the rounded corner of the rounded corner display area is greater than or equals to a curvature $\rho_2$ of the arc.

18. The organic electroluminescent display panel according to claim 6, wherein a curvature $\rho_1$ of the outline of the rounded corner of the rounded corner display area is between 4.5 mm and 10 mm, and a curvature $\rho_2$ of the arc is between 3.7 mm and 5.2 mm.

19. The organic electroluminescent display panel according to claim 6, wherein a central spacing between two adjacent first touch electrodes in the first direction equals to a central spacing between two adjacent second touch electrodes in the second direction.

20. The organic electroluminescent display panel according to claim 6, further comprising:
   touch sensing elements located in a primary display area of the display panel;
   wherein,
   the rounded corner display area does not overlap the primary display area; and
   an outline of each touch sensing element in the primary display area comprises an arc.

* * * * *